United States Patent
Wilson et al.

(10) Patent No.: US 12,154,833 B2
(45) Date of Patent: *Nov. 26, 2024

(54) SEMICONDUCTOR DOPING CHARACTERIZATION METHOD USING PHOTONEUTRALIZATION TIME CONSTANT OF CORONA SURFACE CHARGE

(71) Applicant: SEMILAB Semiconductor Physics Laboratory Co., Ltd., Budapest (HU)

(72) Inventors: Marshall D. Wilson, Tampa, FL (US); Jacek Lagowski, Tampa, FL (US); Carlos Almeida, Tampa, FL (US); Bret Schrayer, Tampa, FL (US); Alexandre Savtchouk, Tampa, FL (US)

(73) Assignee: SEMILAB Semiconductor Physics Laboratory Co., Ltd., Budapest (HU)

( * ) Notice: Subject to any disclaimer, the term of this patent is extended or adjusted under 35 U.S.C. 154(b) by 0 days.

This patent is subject to a terminal disclaimer.

(21) Appl. No.: 18/751,116

(22) Filed: Jun. 21, 2024

(65) Prior Publication Data
US 2024/0347399 A1   Oct. 17, 2024

Related U.S. Application Data

(63) Continuation of application No. 18/123,211, filed on Mar. 17, 2023, now Pat. No. 12,027,430.

(51) Int. Cl.
| | |
|---|---|
| *H01L 21/66* | (2006.01) |
| *G01R 31/308* | (2006.01) |
| *G01R 31/312* | (2006.01) |

(52) U.S. Cl.
CPC .......... *H01L 22/24* (2013.01); *G01R 31/308* (2013.01); *G01R 31/312* (2013.01)

(58) Field of Classification Search
CPC ........ H01L 22/24; G01R 31/308; G01R 31/31
(Continued)

(56) References Cited

U.S. PATENT DOCUMENTS

| | | |
|---|---|---|
| 5,216,362 A | 6/1993 | Verkuil |
| 7,230,443 B1 | 6/2007 | Fung et al. |

(Continued)

OTHER PUBLICATIONS

International Search Report and Written Opinion in International Appln. No. PCT/US2024/019083, mailed on Jul. 17, 2024, 15 pages.

(Continued)

*Primary Examiner* — Alesa Allgood
*Assistant Examiner* — Courtney G McDonnough
(74) *Attorney, Agent, or Firm* — Fish & Richardson P.C.

(57) ABSTRACT

Methods of characterizing semiconductor doping in a wide bandgap semiconductor sample include: measuring an initial value, $V_0$, of a surface voltage at a region of a surface of the semiconductor sample in the dark; charging the region to deep depletion in the dark by depositing a prescribed corona charge at the region; measuring the surface voltage value in the dark at the region after charging; illuminating the charged region with light of a specific photon flux, $f_{eff}$, having a photon energy above the semiconductor bandgap sufficient to generate free minority carriers in the semiconductor sample causing photoneutralization of the corona charge; monitoring of a photoneutralization induced corona charge decay at the region vs. illumination time, t, using a noncontact time resolved measurement of surface voltage, V(t); analyzing the monitored time resolved surface voltage decay data V(t) to determine values for a parameter characteristic of a photoneutralization induced corona charge decay at the regions; and using the parameter at a specific photon flux, $\phi_{eff}$, to characterize the property of the semiconductor at the region based on the values of the parameter.

24 Claims, 9 Drawing Sheets

(58) Field of Classification Search
USPC .................................................. 324/754.21
See application file for complete search history.

(56) References Cited

U.S. PATENT DOCUMENTS

| | | |
|---|---|---|
| 10,969,370 B2 | 4/2021 | Lagowski et al. |
| 12,027,430 B1 | 7/2024 | Wilson et al. |
| 2006/0267622 A1 | 11/2006 | Lagowski et al. |

OTHER PUBLICATIONS

Wilson et al: "Review-Recent Advancement in Charge- and Photo-Assisted Non-Contact Electrical Characterization of SiC, GaN, and AlGaN/GaN HEMT," ECS Journal of Solid State Science and Technology, Aug. 14, 2017, 6(11):S3129-S3140.

Schroder, "Contactless Surface Charge Semiconductor Characterization" Materials Science and Engineering: B, Apr. 30, 2002, 91-92: 196-210.

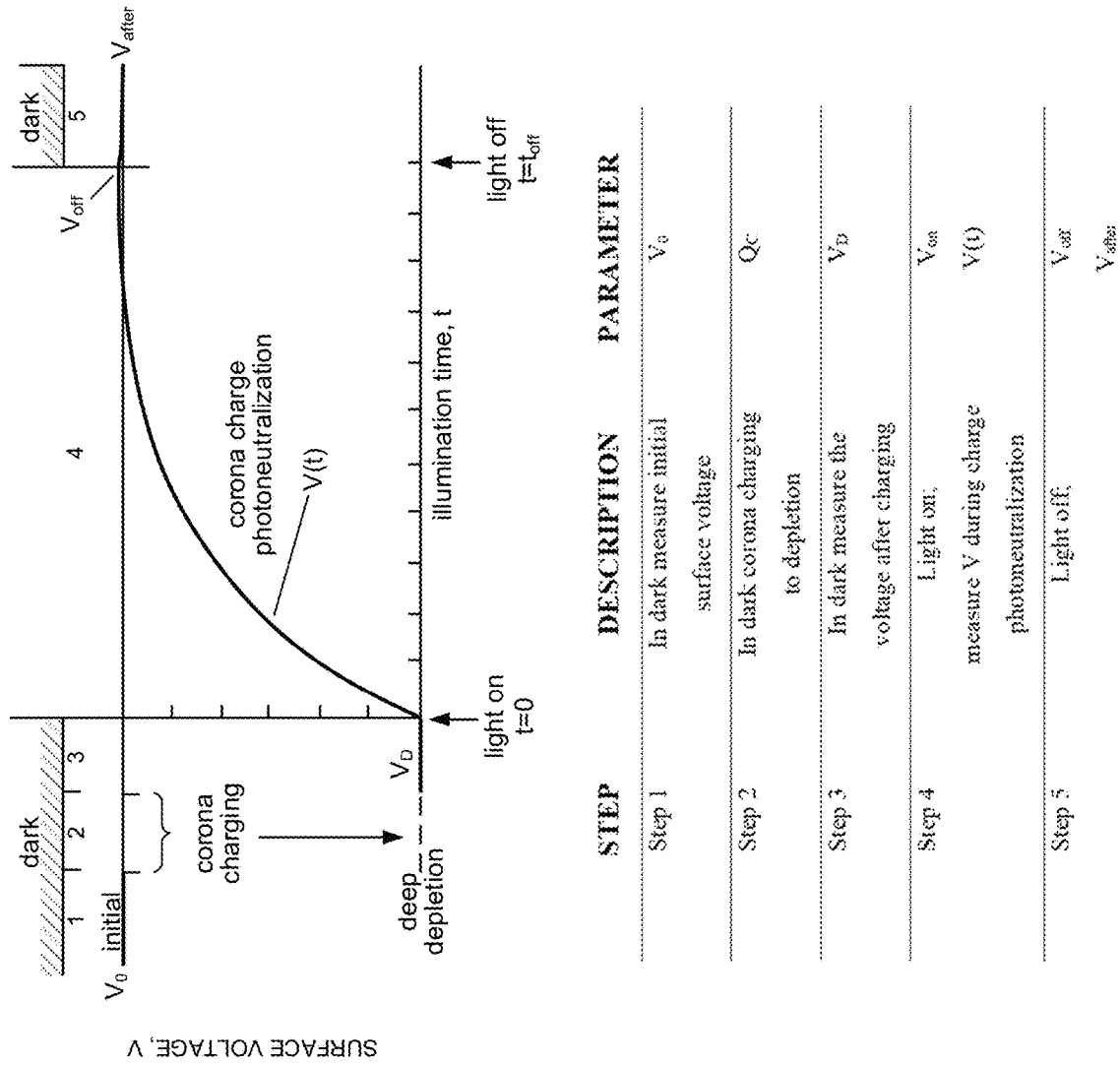

SEMICONDUCTOR DOPING CHARACTERIZATION METHOD USING PHOTONEUTRALIZATION TIME CONSTANT OF CORONA SURFACE CHARGE

CROSS-REFERENCE TO RELATED APPLICATIONS

This application is a continuation of U.S. application Ser. No. 18/123,211, filed Mar. 17, 2023.

TECHNICAL FIELD

This application generally relates to characterization of semiconductor doping in wide bandgap semiconductors and, more particularly, to methods for noncontact measurement of doping in epitaxial layers and systems for performing the measurements.

BACKGROUND

Semiconductor doping with donor or acceptor impurities changes the electrical properties of semiconductors and is a key technology element in the fabrication of semiconductor devices. Doping is generally done by introduction of impurity atoms that replace the host atoms in the lattice of the semiconductor. Doping concentration is the concentration of doping atoms per volume of the semiconductor, and its measurement is often used for quality control in the production of semiconductor devices.

Devices based on wide bandgap semiconductors, including SiC, GaN, AlGaN, and AlGaN/GaN, are widely used in power electronics and high frequency applications, for example. Such devices often include doped epitaxial layers in which stringent doping control of epitaxial wafers is necessary. To satisfy the demands of rapidly growing wide bandgap semiconductor technology and mass epi-wafer manufacturing, a corresponding mass testing of doping is needed. For such a purpose, a noncontact measurement technique may be preferred. Noncontact metrology can eliminate the cost and time involved in fabrication of test devices, and can avoid post measurement wafer cleaning needed in case of many conventional doping measurement methods, such as the Mercury Probe method.

An example of a preparation-free, nondestructive doping measurement method for wide bandgap semiconductors described in U.S. Pat. No. 10,969,370 B2 can be performed using commercially-available Corona noncontact Capacitance Voltage (CnCV) tools manufactured by Semilab SDI.

CnCV uses corona charging to electrically bias a surface of a semiconductor to deep depletion, analogous to the voltage biasing of a metal Schottky barrier, however, realized without metal contacting the semiconductor surface. In the CnCV method, the surface voltage response $\Delta V$ to a charge biasing dose $\Delta Q_C$ is monitored with a Kelvin probe. A differential capacitance, $C=\Delta Q_C/\Delta V$ in sequential charge-measuring gives a noncontact C-V characteristic. Doping concentration, $N_D$, is determined from the slope of $1/C^2$ vs. V that is the standard procedure in C-V methods. The CnCV measurement throughput using commercially-available tools is currently limited to about 5 wafers per hour for a typical 12 site pattern.

SUMMARY

Conventional CnCV techniques can be modified to employ a novel doping sensitive phenomenon that can be exploited to increase testing throughput. Conventional CnCV uses corona-charge biasing to depletion realized with multiple incremental corona charge deposition steps. In response to the deposited charge, the surface voltage, V, changes and it is measured with the noncontact vibrating Kelvin-probe. Similar to the Mercury Probe, and Schottky junction devices, CnCV employs the slope of $1/C^2$-V characteristic in depletion to determine a doping concentration. CnCV is a quasi-static technique with many relatively slow charge biasing steps involved in acquiring a C-V characteristic. This generally limits the speed of measurement and the throughput in multiple wafer monitoring with typical 9 or 12 test sites per wafer and 49 sites wafer mapping.

The deposited corona charge can be rapidly neutralized and removed from bare surfaces of wide bandgap semiconductors by short wavelength illumination. The time constant of corresponding corona photoneutralization can be short, enabling fast sweeping of the depletion barrier. In measurements on differently doped epitaxial SiC, a direct relationship was identified between the corona charge photoneutralization time constant and the doping concentration. This relationship was confirmed for other wide bandgap semiconductors and is valid over a broad range of doping concentration. The enhanced throughput doping measurement method in the present disclosure is based on this newly identified relationship.

Accordingly, in this disclosure, a charge-biasing method with novel doping measuring principle is described that can increase the measurement speed and the throughput, e.g., by as much as ten times compared with the conventional CnCV techniques described above.

The approach described here can replace a sequence of cumulative charge steps with a single large corona charging to deep depletion. Following that, the deposited charge on a semiconductor surface is photoneutralized using near UV illumination generating excess carriers. The photoneutralization time constant is determined from time resolved surface voltage measurement and this time constant is the doping measurement parameter.

In the photoneutralization process, the minority carriers photo-generated within the charge induced surface depletion layer are active. They are directed to the surface by the depletion electric field and are captured by the corona ions which have opposite polarity, neutralizing the corona charge and reducing the depletion width. The technique includes measuring and analyzing a corresponding change of surface voltage versus the time of illumination.

In wide bandgap semiconductors the photoneutralization of corona ions is irreversible. The corona charge does not recover after photoneutralization and photoneutralization induced change of the surface voltage is not reversed in the dark. This enables monitoring of the process by measuring the surface voltage, while illuminating the charged region, or after sequential pulses of illumination. The disclosure encompasses both of the measurement configurations. Specifically, the measurement while illuminating the charged region is employed in the system configuration with illumination under the surface voltage probe. The measurement after illumination pulses is used in a system configuration with illumination at a position separated from the surface voltage probe.

The measurement technique uses the irreversible character of illumination induced surface voltage change to separate the charge photoneutralization from other surface photovoltage effects. Corresponding testing involves monitoring of the surface voltage in the dark after ceasing illumination. For a good measurement condition, dark recovery should be negligible, e.g., in the range of 0.1%.

In certain implementations, the measurement technique employs depletion layer Schottky barrier electrostatic charge-voltage relationships to extract the charge photoneutralization rate, and to determine the photoneutralization time constant, $\tau_{ph}$, from the logarithmic characteristic of the surface voltage versus illumination time. A doping concentration, $N_D$, is determined based on the time constant, $\tau_{ph}$ and the calibrated dependence of $\tau_{ph}$ vs. $N_D$. The time constant versus surface voltage characteristics, $\tau_{ph}$-V provides a means for evaluating a doping depth profile. Uniform doping is recognized by a constant $\tau_{ph}$ value. Differently doped multi-layer films would show different $\tau_{ph}$ values for certain time segments in logarithmic photoneutralization surface voltage characteristic. Corresponding surface voltages reflect different depths beneath the surface.

In general, the measurement arrangement includes three system components with the following capabilities:
(a)-corona charging for charge biasing the semiconductor surface to deep depletion.
(b)-noncontact surface voltage measurement.
(c)-short wavelength illumination with a photon energy above the semiconductor energy gap.

The semiconductor sample wafer can be placed on a conducting chuck with rapid movement capability for positioning the tested sample region (i.e., the test site on the wafer) under the system components (a), (b), and (c), in accordance with the measuring cycle.

An enclosure for the measurement system can be provided to prevent stray light (e.g., short wavelength stray light) from reaching the wafer. Such stray light can otherwise cause uncontrolled corona charge neutralization on the wafer surface.

The time constant, $\pi_{ph}$, can be used directly as a relative doping concentration index. For precise quantitative measurement of doping concentration, the method can include a calibration function of the time constant, determined with measurements on reference sample wafers with known doping concentration. Alternatively, or additionally, a wafer specific calibration may be performed with a corona C-V doping measurement performed on the same sample region (the same wafer site) as the measurement of the photoneutralization time constant, $\pi_{ph}$.

In conventional corona charging methods used for semiconductor and dielectric characterization, a response to a change of deposited corona charge density is often monitored by measuring a corresponding change of the surface voltage. In the present techniques, measurement of surface voltage is also employed, however, the change of corona deposited charge density is realized by photoneutralization of the charge, rather than by charge deposition. The charge photoneutralization and measurement of surface voltage can be performed simultaneously or sequentially, depending on the configuration of the light source and the surface voltage probe. Illumination under the probe enables measurement during the actual corona photoneutralization. This allows for illuminating and measuring the sample site without transferring the wafer between illumination and the measurement probe, which can benefit speed and throughput of measurements. A configuration with a separate light source can facilitate higher uniformity of illumination than illumination under the surface voltage probe. This can benefit accuracy and tool to tool matching.

The disclosed technique can use a multiplicity of light sources with different configurations and wavelengths that can be selected and optimized according to the requirement of the specific semiconductor wafer fabrication the technique is used for.

In general, in one aspect, the disclosure features a method of characterizing semiconductor doping in a wide bandgap semiconductor sample, the method including: measuring an initial value, $V_0$, of a surface voltage at a region of a surface of the semiconductor sample in the dark; charging the region to deep depletion in the dark by depositing a prescribed corona charge at the region; measuring the surface voltage value in the dark at the region after charging; illuminating the charged region with light of a specific photon flux, $f_{eff}$, having a photon energy above the semiconductor bandgap sufficient to generate free minority carriers in the semiconductor sample causing photoneutralization of the corona charge; monitoring of a photoneutralization induced corona charge decay at the region vs. illumination time, t, using a noncontact time resolved measurement of surface voltage, V(t); analyzing the monitored time resolved surface voltage decay data V(t) to determine a photoneutralization time constant, $\tau_{ph}$; and using the photoneutralization time constant, $\tau_{ph}$ at a specific photon flux, $f_{eff}$, as a semiconductor doping index and characterizing a semiconductor doping concentration at the region based on its value.

Implementations of the method can include one or more of the following features.

The method can include characterizing a doping concentration depth profile for the semiconductor sample based on a surface voltage specific corona charge photoneutralization time constant $\tau_{ph}$ versus V.

The method can include characterizing doping of the single epitaxial layer based on an average $\tau_{ph}$ value over a range of surface voltages.

In some examples, $\pi_{ph}$, is determined according to the equation:

$$\tau_{ph}^{-1} = -\frac{d\ln|V(t) - V_{const}|}{dt},$$

in which t is an illumination time and $V_{const}$ is a surface voltage probe offset. The method can include determining a calibration function, $\tau_{ph}$ vs $N_D$, and an inverse calibration function, $N_D$ vs $\tau_{ph}$, denoted $f_{cal}$ using a calibrating measurement of $\tau_{ph}$ on one or more reference samples with known doping concentration values, $N_D$. In some examples, the method includes normalizing a time constant, $\pi_{ph}$, measured at an effective photon flux, $\phi_{eff}$, to a calibration photon flux, $\phi_{cal}$, $$\tau_{ph}^* = \frac{\phi_{eff}}{\phi_{cal}} \cdot \tau_{ph};$$

and determining an absolute doping concentration using the normalized as: time constant $\tau_{ph}$* according to the equation: $N_D = \pi_{ph} \cdot f_{cal}$.

The method can include calibrating $\tau_{ph}$ for a doping concentration, wherein the calibration is specific to the semiconductor wafer sample, and it is performed on one site of the measured wafer sample during the multi-site (e.g., 9 sites, 12 sites, or 49 sites) $\tau_{ph}$ based characterization of the wafer sample with all $\tau_{ph}$ measurements being performed under the same illumination condition. The calibration can include the measurement of the corona charge photoneutralization time constant, $\pi_{ph}$, and the independent measurement of the doping concentration, $N_D$, with the corona noncontact C-V (CnCV) method, wherein both measurements are performed in sequence, one after another, at the same wafer site, and in a similar corona charge induced depletion voltage range. The method can include the use of ph and $N_D$ to determine the wafer specific inverse calibration function value, foul, satisfying $N_D = \tau_{ph} \cdot f_{cal}$.

In some examples, the method includes determining a doping concentration at all different wafer sites, based on determining $\tau_{ph}$ at each wafers site, and using the wafer specific value of $f_{cal}$, determined on a single site.

The capacitance probe can be a non-contact vibrating Kelvin probe.

The region can be illuminated simultaneously with monitoring the surface voltage or the region can be illuminated separate from monitoring the surface voltage.

The semiconductor sample can include a semiconductor selected from the group consisting of SiC, GaN, and AlGaN.

The method can include identifying a defective region of the semiconductor sample based on $V_{Dark}$ and a dark decay rate $\Delta V_{Dark}/\Delta t_{Dark}$ measured after corona charging but before the illuminating.

The method can include identifying a contribution to the monitored surface voltage from surface photovoltaic effects other than the corona photoneutralization based on a dark decay magnitude, $\Delta V_{Dark}$, measured after the illuminating.

Other features and advantages will be apparent from the drawings, the description, and the claims.

BRIEF DESCRIPTION OF THE DRAWINGS

FIG. 2 is an illustration of steps in an example measurement flow for determining the photo-neutralization time constant from a time resolved surface voltage decay.

DETAILED DESCRIPTION

Figure 1A:
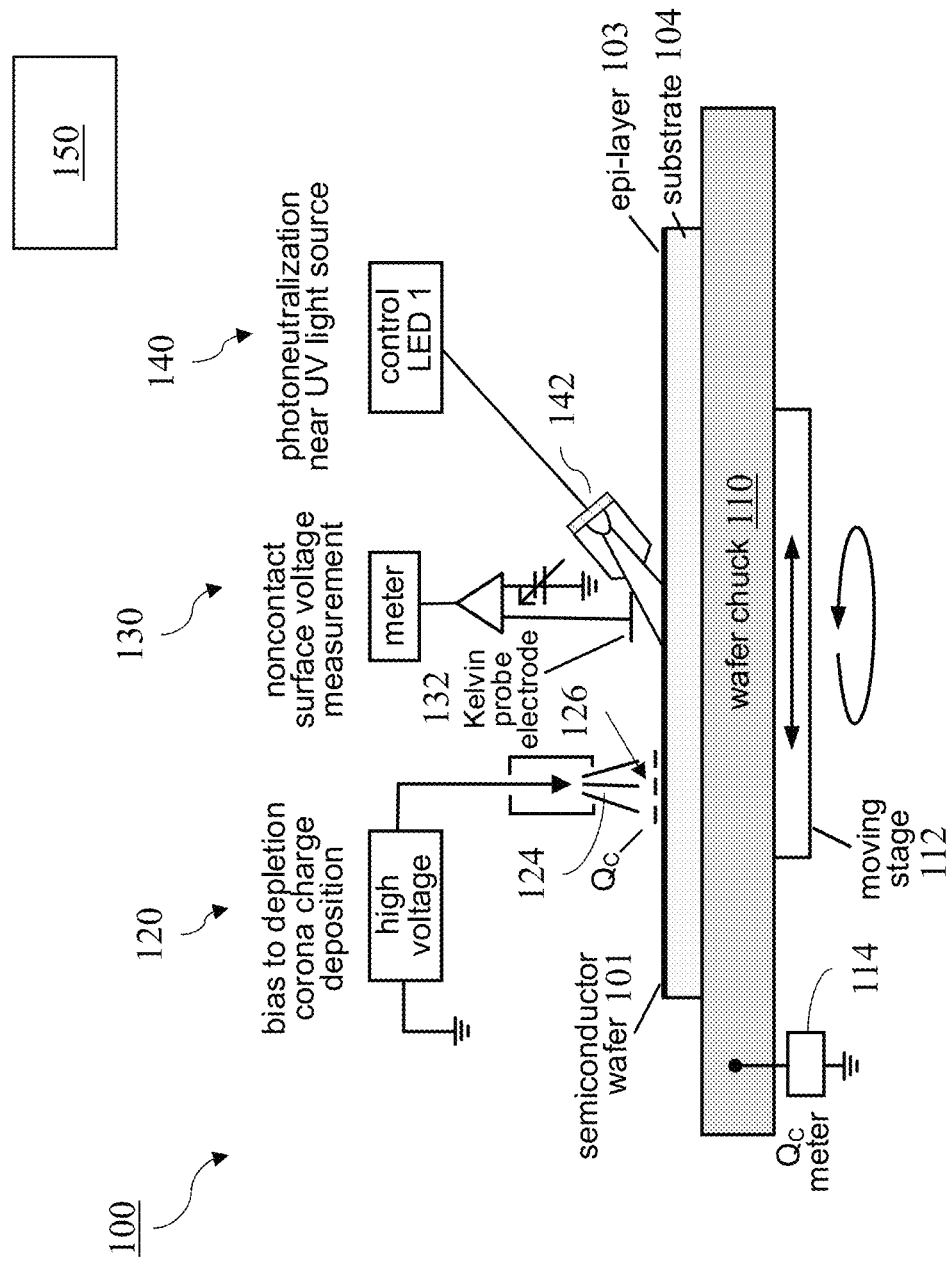
FIG. 1A is a schematic diagram of an example system for measuring doping of a semiconductor wafer using corona charge deposition followed by illumination induced charge photoneutralization and photoneutralization time constant determination from the noncontact time resolved surface photovoltage. In this example, the configuration includes illumination positioned under the surface voltage probe.

Referring to FIG. 1A, an example apparatus 100 for corona charge-voltage photoneutralization characterization of a semiconductor wafer sample 101 is shown schematically. Wafer sample includes a substrate 104 and an epitaxial layer 103 supported by the substrate 104. The apparatus 100 includes a corona charge source module 120 for precise charge deposition on a test site 126, a surface voltage measurement module 130 for surface voltage measurement, and a light source module 140 for illuminating the wafer surface.

Wafer 101 is supported by a wafer chuck 110, which is positioned on a movable stage 112. Stage 112 can move the wafer chuck by translations and rotations. A coulombmeter 114 is connected to the wafer chuck 110.

Corona charge source module includes a corona charge electrode arranged to deposit corona charge 124 on a site 126 on the surface of wafer 101. Surface voltage measurement module 130 includes a Kelvin probe that has an electrode 132 arranged to vibrate a small distance (e.g., a millimeter or less) above the surface of wafer 101. While the example described here uses a Kelvin probe, other capacitance probes can be used.

Light source module 140 includes a light source 142 arranged to illuminate the surface of the wafer 101 located directly beneath the Kelvin probe electrode. During operation, light source 142 delivers illumination having a wavelength suitable for corona charge photoneutralization at the wafer surface beneath Kelvin probe electrode 132. Light source 142 can include a light emitting diode (LED) or a near UV laser, for example. For an LED, the light beam can be additionally monochromatized by passing through the narrow band pass filter.

Figure 1B:
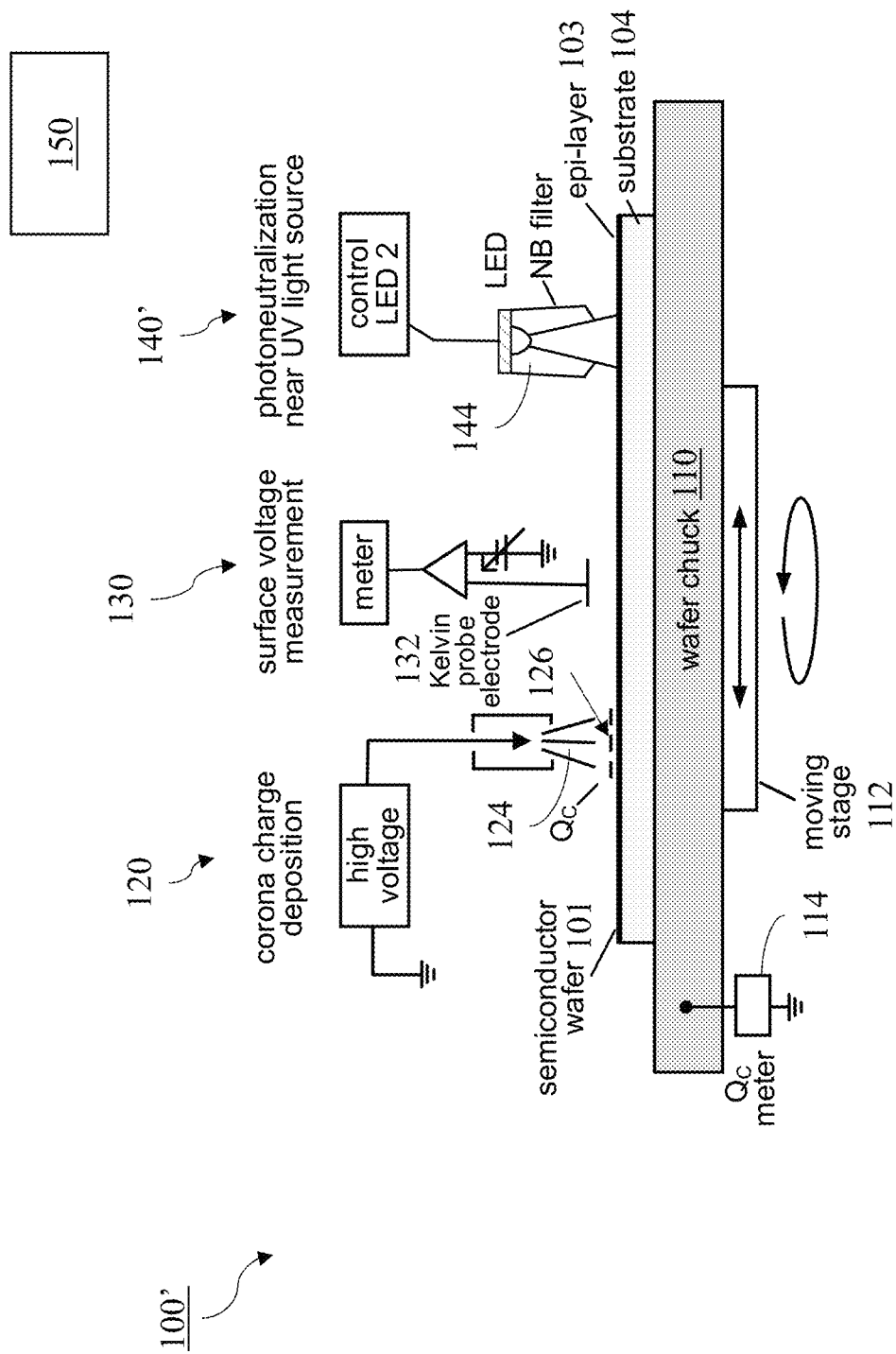
FIG. 1B is a schematic diagram of an alternative configuration of the examples system shown in FIG. 1A in which the illumination is at a position separated from the surface voltage probe.

Referring to FIG. 1B, an alternative apparatus 100' is shown in which the light source module 140' includes a light source 144 positioned to illuminate a different site on the surface of wafer 101 from the site under electrode 132. Like light source 142, light source 144 can include an LED or a laser capable of emitting light having a wavelength suitable for corona charge photoneutralization. In general, the wavelengths of illumination provided by light sources 142 and 144 can be selected depending on the wafer under test. Generally, photon energy should be above the semiconductor energy gap. For measurements on 4H-SiC with an energy gap of 3.26 eV, an appropriate light wavelength includes $\lambda=355$ nm or $\lambda=325$ nm corresponding to photon energies hv=3.49eV and hv=3.82 eV, respectively. Both photon energies exceed the SiC energy gap, as needed for generation of free carriers (electron-holes) involved in the corona charge photoneutralization process. For measurements on other semiconductors, the light wavelength can be selected based on the energy gap and value of the absorption coefficient. The shorter wavelength $\lambda=315$ nm illumination can be appropriate for measurement of doping on GaN and AlGaN material that has an energy gap larger than that of SiC. Light of other wavelengths of about 380 nm or less can be used, depending on the application. Light sources 142 and 144 are arranged to provide uniform illumination within the surface area of the corona charged spot, e.g., a circular spot about 10 mm or less in diameter (e.g., about 6 mm in diameter).

A computer controller 150 is used to control the operation of the apparatus and perform data analysis to determine information about the doping of the sample 101 using the measurement and analysis steps described below.

The example apparatus 100 and 100' shown in FIG. 1A and FIG. 1B, respectively, illustrates two configurations of illumination: i.e., the light source 142 (LED 1) for illumination under the vibrating electrode of the Kelvin probe electrode 132, and the light source 144 (LED 2) for illumination separate from the Kelvin probe 132. Standard high precision Kelvin probes can use gold electrodes that are nontransparent. In cases where the Kelvin probe electrode 132 is nontransparent, a low angle illumination from the side can be used, as schematically shown in FIG. 1A for light source 142. In some implementations, a transparent Kelvin probe with illumination through the electrode can also be used. In general, high uniformity of illumination may be easier to achieve in the case of separate illumination with light source 144, shown in FIG. 1B.

In the Kelvin probe method, a capacitive electrode, vibrating a fraction of mm above the measured surface generates alternating current that is nulled by compensating DC bias, providing a measure of the voltage difference between the electrode and the semiconductor. For the present application, an accurate and fast-responding Kelvin probe is preferred, such as a probe with a time constant of about 5 ms with 0.2 mV precision. A surface voltage measuring range from −100 to +100V is typical for corona charge biasing to deep depletion for n-type (negative bias) and p-type (positive bias) semiconductors. An electrode diameter of 1 mm or 2 mm is suitable for measuring surface voltages in the uniform center region of the corona charged and illuminated area.

Corona charging is realized using a corona discharge in air produced by a high DC voltage applied from power supply 122 to discharge electrode 124. The negative polarity discharge in air produces $CO_2$ ions, while the positive polarity discharge produces $(H_2O)_nH^+$ ions. The corona discharge electrodes (a needle for point charging or a wire for whole wafer charging) can be confined in an enclosure and the ion deposition is not field driven; instead ions diffuse to the wafer surface through an aperture opening. Considering the very short mean free path of $10^{-5}$ cm at room atmosphere, the ions lose kinetic energy and become thermalized before reaching the semiconductor surface. Such a configuration enables noninvasive corona charge biasing. Precise corona charging is typically performed in a cleanroom environment with controlled humidity and temperature. Control of the deposited corona charge density is realized by setting the corona power supply 122 high voltage, the discharge current, and deposition time period. The deposition time period can be about 1 second or less. The deposited charge density dose can be in-situ monitored with the coulombmeter 114.

Corona charging to deep depletion extends from about $1 \times 10^{12}$ q/cm$^2$ up to about $1 \times 10^{13}$ q/cm$^2$ and the charging can be realized in a single charging step. The charge deposited on the surface at test site 126 is mirrored as opposite charge in the semiconductor surface space charge region and acts as an electrical bias. The charging dose is much larger than the initial present surface charge, typically about $1 \times 10^{11}$ q/cm$^2$. Thus, depending on the doping concentration, $N_D$, the charging dose, $Q_C$ can be selected to obtain a desired width of depletion $W_D = -Q_C/qN_D$.

Wide bandgap semiconductor devices are fabricated mostly on n-type epitaxial layers and 4H-SiC is a commonly used material. Accordingly, illustrating example results of the method are presented in this disclosure for n-type 4H-SiC and negative polarity corona charging. For measuring of such wafers, the method can further include stabilizing fresh epitaxial 4H-SiC wafers using a UV pretreatment chamber, that can be part of apparatus 100. Immediately after the epitaxial growth process, 4H-SiC may exhibit rapid dissipation of deposited corona charge. This is caused by surface diffusion of corona ions. If present, this effect can interfere with measurements of the light induced charge photoneutralization. Pretreatment eliminating the surface diffusion effect can be performed concurrently with the doping measurement on sets of multiple wafers. Such a capability can be added to an automated version of apparatus 100.

Stabilized bare surfaces of SiC in depletion typically exhibit good stability of corona charge in the dark. The large energy gap prevents thermal generation of free minority carriers that could neutralize corona charge. In the method, the charge stability in the dark after charging is verified by corresponding stability of the surface voltage. For that purpose, the method can include a prescribed period of surface voltage measurement in the dark after charging, but before illumination. Such a measurement is an example of a dark decay rate measurement and yields a decay rate based on the change of dark surface voltage, $V_{Dark}$, as a function of time. A large dark surface voltage decay rate and a lower than nominally expected surface voltage magnitude for the deposited charge density, can be indicative of defects causing charge dissipation and thus interfering with corona charge photoneutralization measurement. In such a case, the measurement can be repeated on a neighboring wafer site free of defects and with a negligible dark decay rate. In epitaxial 4H-SiC, used as an example in this disclosure, the interfering defects are device-killing triangular defects, downfall defects, or carrot defects. These defects can have submillimeter dimensions and shifting the measurement location by a distance greater than the diameter of the Kelvin probe, e.g., 3 mm to 5 mm in the case of a 2 mm diameter Kelvin probe, can be sufficient to eliminate interference.

In some implementations, an additional verification step can also be performed. For example, such a step can include a measurement of surface voltage performed in the dark after turning off the light induced charge photoneutralization. This verification relates to the irreversible character of the photoneutralization and is aimed at recognition of other surface photovoltaic effects in the surface depletion layer that are reversible.

Generally, measurements are performed under conditions when the corona charge photoneutralization dominates. This can be tested in measurement of surface voltage recovery in the dark, performed immediately after illumination. For optimized measurement conditions, the magnitude of such a surface voltage recovery, indicative of other effects, should be, i.e. insignificant compared to corona charge photoneutralization magnitude, e.g., in the range of about 100 mV or less for corona charge photoneutralization magnitude of about 20 V or more. In SiC, such an insignificant contribution can be achieved using low effective photon flux in the about $10^{13}$ to about $10^{14}$ photons/cm$^2$s range.

The characterization of semiconductor doping includes determining the time constant, $\tau_{ph}$, of corona charge photoneutralization under the surface depletion condition. Once $\tau_{ph}$ is determined it serves as a doping index. The $\tau_{ph}$ values are transformed to doping concentration as $N_D = \tau_{ph} \cdot f_{cal}$, where $f_{cal}$ is the so called inverse calibration function. The determination of the time constant $\tau_{ph}$ and the calibration function $f_{cal}$ is discussed further below.

Steps involved in a measurement flow that can be used in acquiring the time resolved surface voltage data for determining the photoneutralization time constant are shown in a table in FIG. 2. The measured surface voltage at each step is shown in a plot included in FIG. 2. The surface voltage measurements are characteristic for a typical n-type epitaxial wafer of 4H-SiC measured using apparatus 100 or 100' and the illumination configuration illustrated in FIG. 1A. The wafer is held on the conducting chuck 110 by the vacuum suction. During corona charging and measuring, the chuck 110 provides a backside electrode capacitively coupled with the wafer. The noncontact character of the method refers to the lack of any physical contact to the wafer front surface, in this case the surface of epi-layer 103. All lights in the system are initially turned off and the wafer is in the dark. The wafer chuck is moveable and for the Step 1 in FIG. 2, it positions the wafer test site under the Kelvin probe electrode 132 for measurement of an initial surface voltage in the dark, $V_0$, for example $V_0$=0.8V. After the initial surface voltage measurement, the test site 126 is transferred to a position under the corona charging source (as shown in FIG. 1A and FIG. 1B) and in Step 2 the negative charge with prescribed charge density $Q_C$, for example $-1.5 \times 10^{12}$ q/cm², is deposited on the surface of epi-layer 103 at test site 126. As a result of the charge deposition, the surface is biased into deep depletion. For Step 3, the charged site is shifted to a position under the Kelvin probe electrode 132. The deep depletion surface voltage after charging is then measured, giving a post charging value, for example $V_D$=-59V. In Step 4, the test site is illuminated with short wavelength light with a photon energy above the 3.26 eV energy gap of 4H-SiC appropriate to cause photoneutralization of the corona charge. For example, a 325 nm wavelength (hv=3.82eV) illumination with a near UV LED can be used. In the example shown in FIG. 1A, illumination under the Kelvin probe electrode 132 with light source 142 can be used, enabling continuous monitoring of the depletion layer surface voltage, V(t), while illuminating the charged region. In the case of example apparatus 100', shown in FIG. 1B, the illumination is at a separate location than the surface voltage probe. Thus, the monitoring cannot be performed while illuminating the charged region. Instead, it is done using a sequence of steps comprising short illumination periods (typically about 10 ms to 20 ms duration) and surface voltage measurements. In this sequence, the charged region is being shifted from a position under the surface voltage measurement probe 132 to a position under the illumination source 144 and then back to surface voltage probe . . . and so on.

The last Step 5 in the measuring cycle includes recording of the surface voltage after turning the short wavelength light off. This value is referred to in FIG. 2 as the dark voltage, $V_{after}$. A very small depletion voltage recovery is used to confirm a negligible contribution from surface photovoltaic effects other than the corona charge photoneutralization.

Figure 3B:
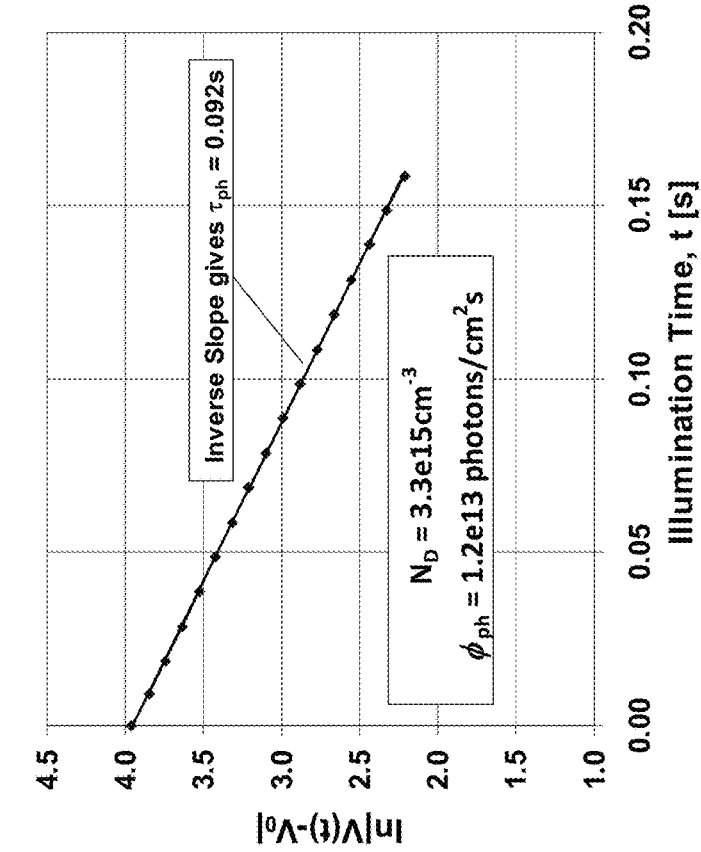
FIG. 3B is a plot of an example used for determining the photoneutralization time constant corresponding to the transient in FIG. 3A.
Figure 3A:
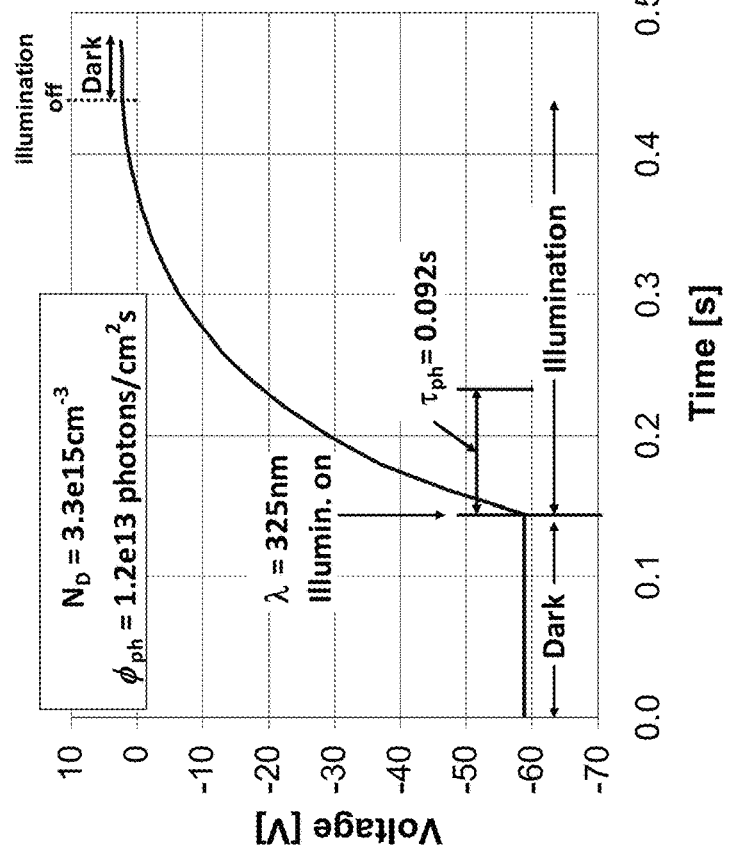
FIG. 3A is a plot showing an example result of the surface voltage vs. illumination time measured during corona charge photoneutralization.

An example of measured V(t) is shown in FIG. 3A. The initial portion of the voltage transient in the dark shows no decay prior to illumination. This dark portion is an indicator of negligible charge dissipation due to surface diffusion or any defect related charge neutralization. During illumination, rapid photoneutralization of corona charge is evident as a corresponding surface voltage decay. This recorded V(t) time dependence can be reliably analyzed using Schottky barrier voltage-charge equations providing a means for determining the corona charge photoneutralization time constant $\pi_{ph}$. The quadratic relation between the depletion surface barrier and the surface charge density ($V_D \sim Q_C^2$) can be used for derivation of the surface voltage decay corresponding to the corona charge decay. In practice $\tau_{ph}$ can be determined from the inverse slope of logarithmic surface voltage time decay during photoneutralization, as $$\tau_{ph} = -\left(\frac{d\ln|V(t) - V_0|}{dt}\right)^{-1}$$

where $V_0$ is the initial precharging value, including the offset related to the Kelvin probe calibration. This is illustrated in FIG. 3B for the V(t) data in FIG. 3A.

Such a fitting procedure gives an average $\pi_{ph}$ value in the prescribed surface voltage range, in this case between $-5V$ and $-59V$. Good linear fitting in FIG. 3B indicates a constant $\pi_{ph}$ value in this range. This is consistent with uniform doping vs. depth in this epitaxial layer.

For doping depth profiling, the voltage specific time constant corresponding to a given depletion surface voltage, V, on the photoneutralization V vs. illumination time characteristic V(t), can be used. It is calculated from the relative surface voltage decay rate as $$\tau_{ph}^{-1}(V) = -\frac{1}{|V(t) - V_0|} \cdot \frac{dV}{dt}\bigg|_V.$$

Figure 3C:
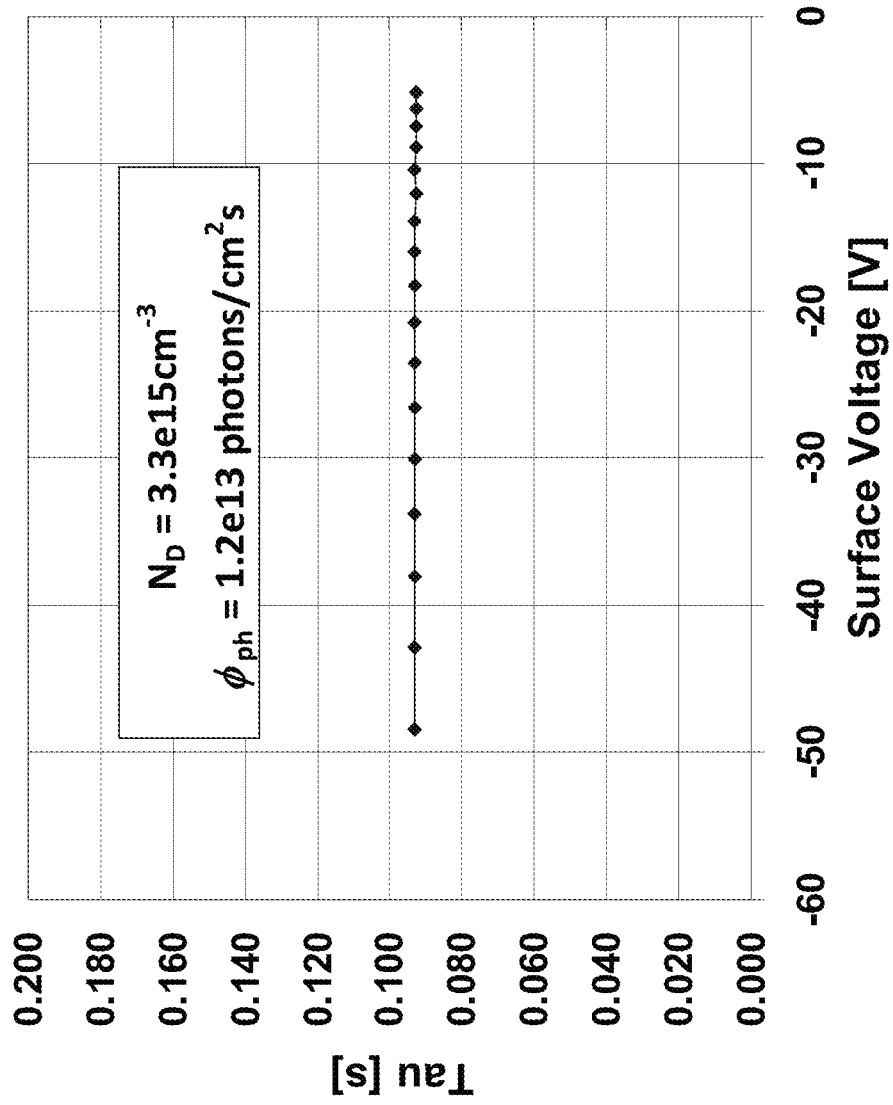
FIG. 3C is a plot of surface voltage specific, $\tau_{ph}$, illustrating a case of a uniform doping depth profile.

FIG. 3C illustrates the voltage specific $\pi_{ph}$ as a function of depletion surface voltage for the data in FIG. 3A indicating a constant $\tau_{ph}$ value in this voltage range consistent with a uniform doping depth profile in this epitaxial layer.

Figure 4:
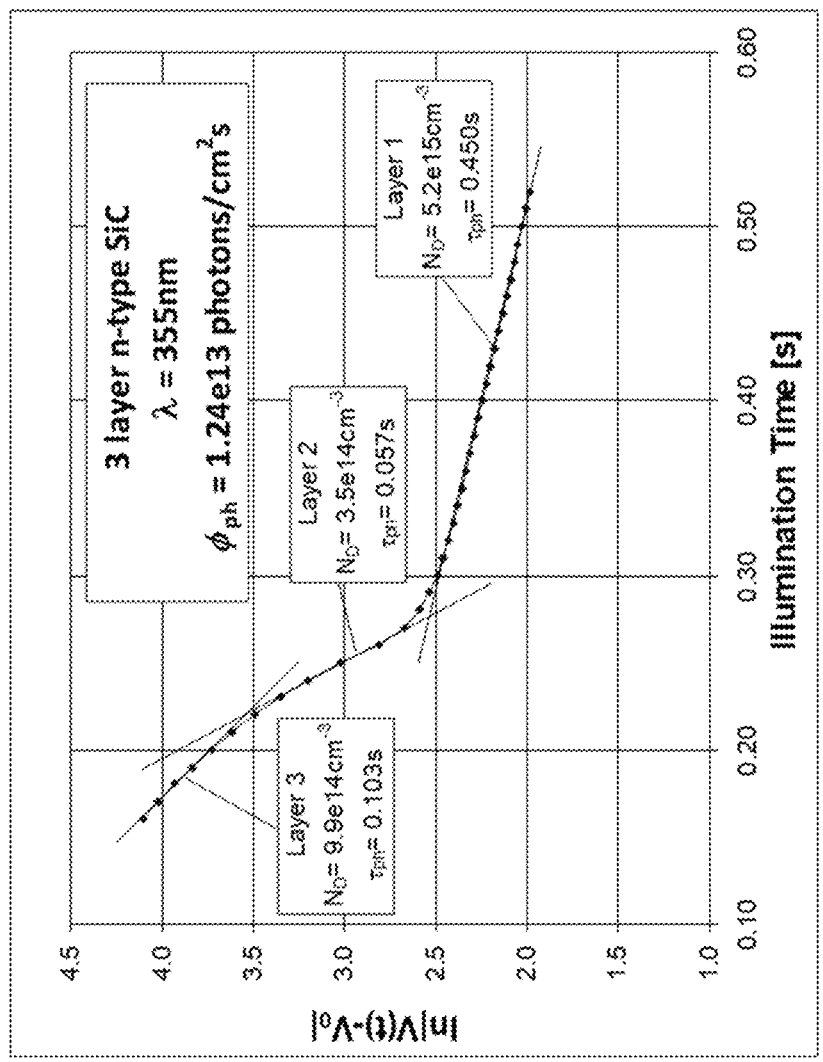
FIG. 4 is a plot of an example illustrating the corresponding logarithmic surface voltage decay for a n-type SiC epitaxial wafer with 3 layers of different doping.

An example in FIG. 4 illustrates the logarithmic surface voltage time decay for an epitaxial wafer with 3 layers of different doping. Each layer is characterized by the corresponding $\tau_{ph1}$, $\tau_{ph2}$ and $\tau_{ph3}$ that scale with the doping values. The layers 1, 2 and 3 are counted from the top of the epitaxial layer structure.

Figure 5:
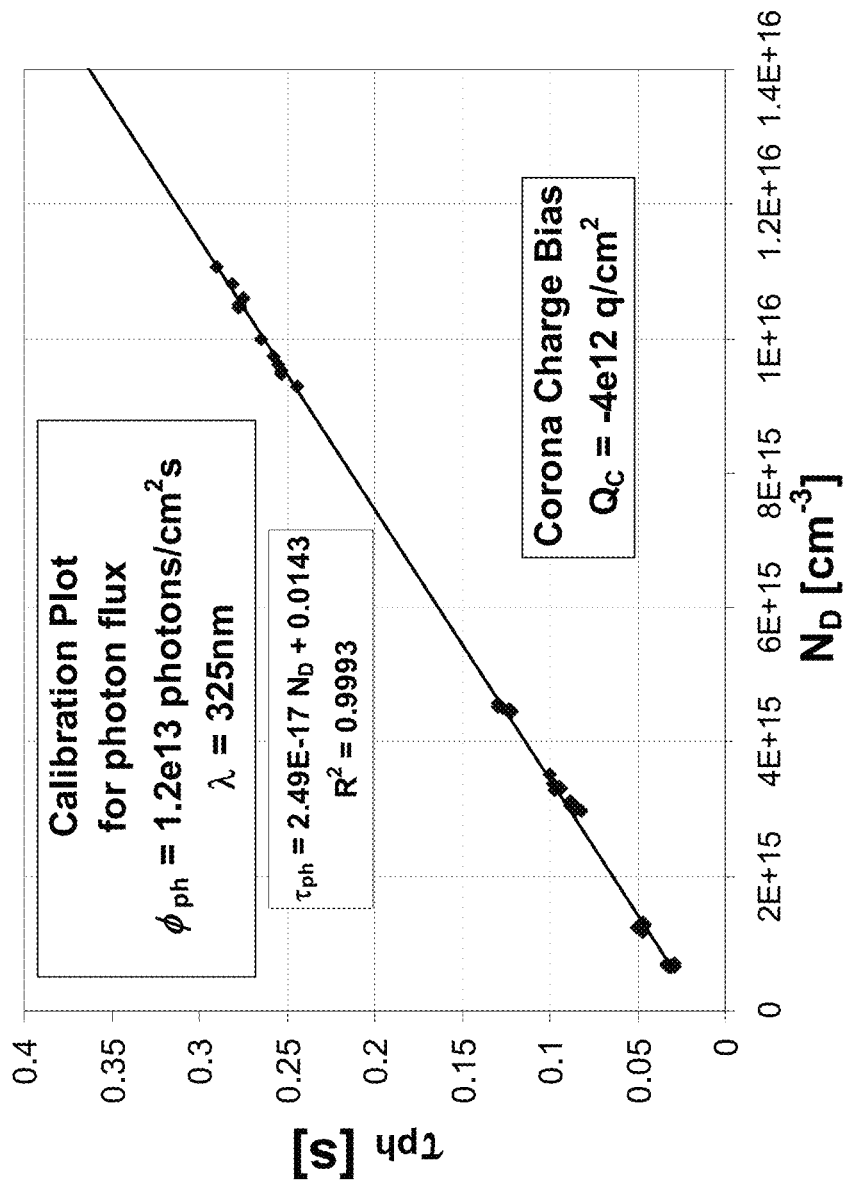
FIG. 5 is a plot of example doping calibration results illustrating of the photo-neutralization time constant $\tau_{ph}$ dependence on the doping concentration, $N_D$, measured on n-type 4H-SiC. Measurements were done using a negative corona charging charge density of $-4E12$ q/cm$^2$. 325 nm wavelength illumination with an incident photon flux of $1.2 \times 10^{13}$ photons/cm$^2$s was used. Doping concentration, $N_D$, corresponds to C-V mercury probe results.

FIG. 5 presents the dependence of the photoneutralization time constant $\tau_{ph}$ on doping concentration, $N_D$, for n-type 4H-SiC and illumination with light of the wavelength $\lambda$=325 nm and an effective incident photon flux of $\phi_{eff}$=1.2×10¹³ photons/cm²s. Such dependence is useful for determining the calibration function, $N_D$ vs. $\tau_{ph}$, corresponding to a specific doping range, $N_D$, and illumination condition, $\lambda$ and $\phi_{eff}$.

Figure 6:
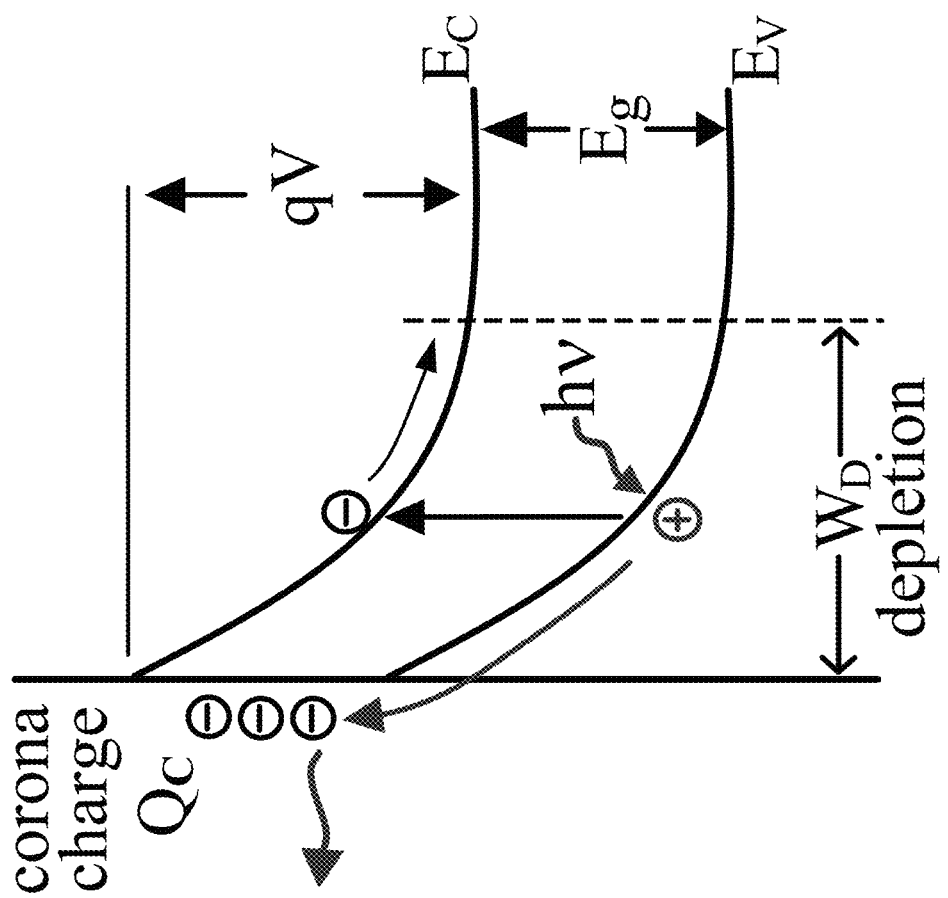
FIG. 6 is an energy band diagram illustrating photoneutralization of corona charge on a n-type wide bandgap semiconductor. The threshold energy, hv, is the energy gap, $E_g$.

The increase of the photoneutralization time constant, $\pi_{ph}$, with increasing of dopant concentration, $N_D$, is typically a consequence of a smaller surface depletion width $W_D$=$Q_C$/$qN_D$ for the same corona charge, $Q_C$. This results in smaller photogeneration of holes within depletion. As depicted in FIG. 6, free holes, h⁺, generated in depletion are active in photoneutralization, and they are directed to the surface by the depletion electric field. At the surface, negative corona ions capture holes, Q⁻+h⁺→Q↑ and neutralized corona species detach from the surface.

Figure 7:
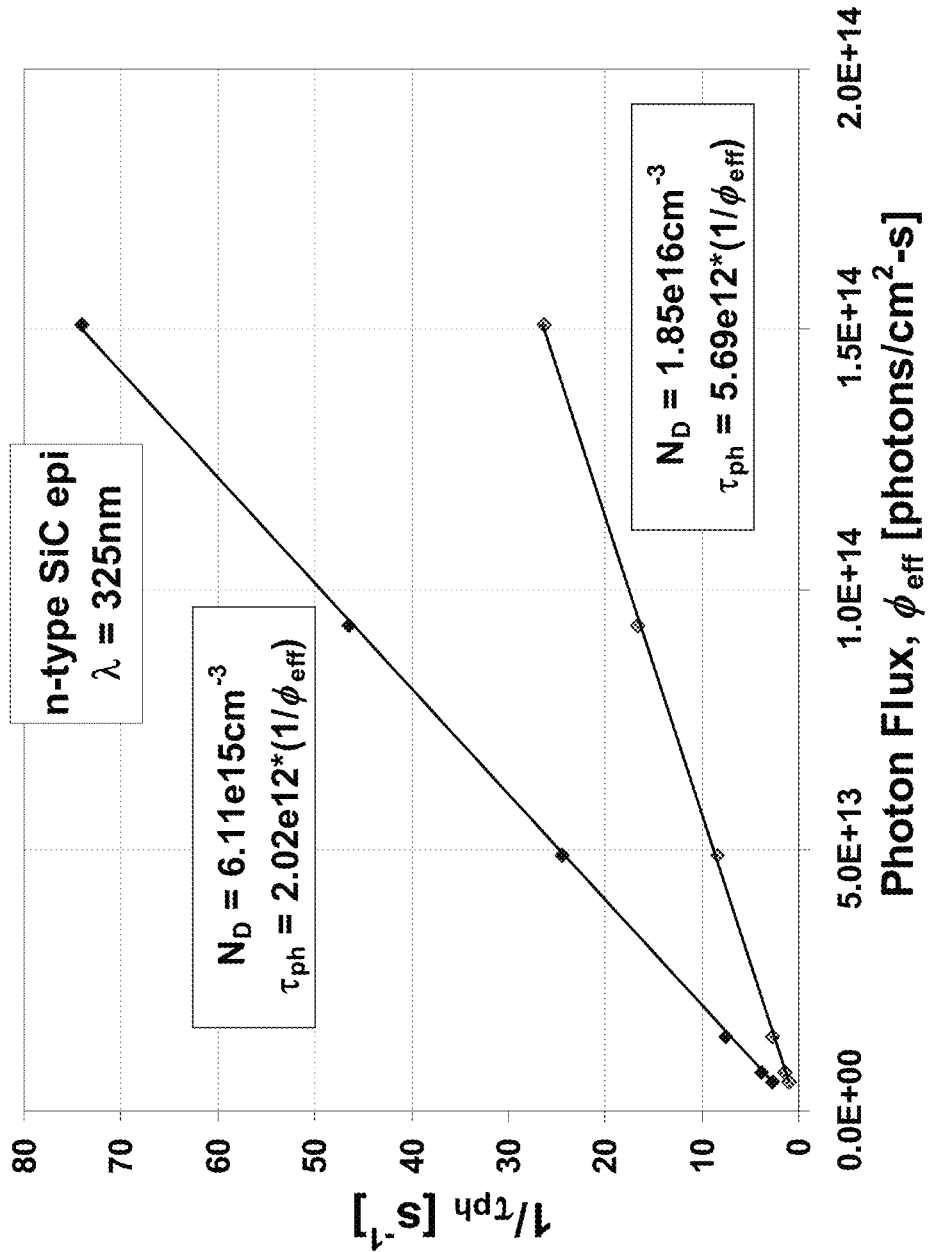
FIG. 7 is a plot of example results illustrating the photoneutralization time constant dependence on the incident photon flux. Results are for n-type SiC with doping concentrations of $N_D=6.11e15$ cm$^{-3}$ and $N_D=1.85E16$ cm$^{-3}$. $N_D$ values are based on C-V mercury probe results.

At increased doping, smaller hole generation caused by the reduced depletion width can be overcome by increasing the incident photon flux, $\phi_{eff}$. As shown in FIG. 7, $\tau_{ph}$ is inversely proportional to the incident photon flux. Accordingly, a rapid measurement can be realized at higher $N_D$ by increasing the incident photon flux. In the method, the speed of measurement is a major advantage. In this respect, the inverse proportionality of the time constant, $\tau_{ph}$ and the incident photon flux ($\tau_{ph} \sim 1/\phi_{eff}$) can be useful for optimizing the measurements. For example, a time constant $\tau_{ph}$ of about 0.1s can be realized for $N_D$ in $10^{16}$ cm$^{-3}$ range by increasing the photon flux to the $10^{14}$ photons/cm$^2$s range. High doping, such as $10^{18}$ cm$^{-3}$, can be rapidly measured combining increased photon flux and shorter wavelength of light, such as, $\Delta$=315 nm or $\lambda$=300 nm.

As noted previously, calibration can be useful for transforming the measured time constant to doping concentration. For this purpose, a family of specific calibration functions can be determined for specific doping ranges and values of ($\lambda$, $\phi_{eff}$). For accurate measurement, the individual, specific calibration functions can be limited to subsets of the entire range of values for $N_D$ and $\phi_{eff}$, for example, the accurate calibration functions can cover a one order of magnitude range in $N_D$ and $\phi_{eff}$, or less. The calibration functions can be determined using measurements on reference wafers with known doping concentrations and precise setting of illumination conditions. For example, wafers with $N_D$ premeasured with the mercury probe C-V method or wafers pre-measured with the corona noncontact C-V method (CnCV) can be used. Exactly the same illumination conditions can then be used in the measurement of doping in fabricated epitaxial layers in a production environment.

Quantitative determination of the doping concentration from calibrated $\tau_{ph}$ vs $N_D$ data uses the inverse function $N_D$ vs $\tau_{ph}$ that is denoted $f_{cal}$. The measurements are performed at the same wavelength as the one used for calibration, for example $\lambda$=325 nm in FIGS. 5 and 7. The photon flux used during measurement, $\phi_{eff}$ is typically different than that used for calibration, $\phi_{cal}$, since it is adjusted considering the speed of measurement requirement. The measured $\pi_{ph}$ is normalized based on the $\tau_{ph}$ dependence on the incident photon flux. The normalized value $\tau_{ph}$*=($\phi_{eff}/\phi_{cal}$). $\tau_{ph}$ is then used in the inverse $N_D$ vs $\tau_{ph}$ function, $f_{cal}$, to calculate doping concentration as $N_D=\tau_{ph}$*·$f_{cal}$ In the example in FIG. 5, the $\pi_{ph}$ calibration was performed at $\phi_{cal}$=1.2e13 photons/cm$^2$s. However, applied to different photon fluxes as shown in FIG. 7, this calibration gave correct $N_D$ values, agreeing to within 0.5%.

An alternative method uses a wafer specific calibration that is performed during an actual measurement of a given wafer. Apparatus 100 and 100', shown in FIG. 1A and FIG. 1B, respectively, is suitable for this purpose. The wafer specific calibration involves: (1) the measurement of the corona charge photoneutralization time constant, $\tau_{ph}$ and (2) the different, noncontact C-V (CnCV) measurement of the doping concentration, $N_D$. These two independent measurements are performed on the same wafer site, one after the other. The results are used to determine the inverse calibration value function, $f_{cal}$, satisfying $N_D=\pi_{ph}$. $f_{cal}$ On all other tested sites of this wafer, only $\tau_{phk}$ is measured (k is the site number). The doping $N_{DK}=\tau_{phk}\cdot f_{cal}$ at different k sites on the wafer is determined using the as measured $\tau_{phk}$ and the same value of the wafer specific function, $f_{cal}$.

In general, the measurements with wafer specific calibration are done with the same illumination condition for all measured sites. This condition can be optimized for different doping ranges. However, the exact knowledge of the incident photon flux is not required because this approach uses the as measured $\pi_{ph}$, rather than $\tau_{ph}$* normalized to photon flux. The measurements described above can be performed at any number of sites on a wafer. Typical fabrication line testing involves 12 wafer site measurement or 49 site wafer mapping. The wafer specific calibration adds a one site CnCV doping measurement time that is typically 40 seconds. A $\tau_{ph}$ measurement time at a single site is shorter, e.g., about 4 seconds. For 12 site testing with wafer specific calibration, the measuring time per wafer can be about 90 seconds. This measurement speed can give a throughput of about 30 wafers/hr, including the wafer handling overhead time. For 49 site wafer mapping with 40 second additional calibration time, results in about 240 seconds total measurement time and a throughput of about 13 wafers/hr with wafer handling overhead.

Measurements using the wafer specific calibration can reduce uncertainty with reproducing the illumination conditions and still offer very fast, high throughput epitaxial SiC doping monitoring.

The photoneutralization method, described above, employs specific photoneutralization time constant definitions based on a logarithmic type analysis of the charge decay. One shall point out, however, that in general, the photoneutralization kinetic sensitivity to doping, identified in this invention, can use different time constant definitions for doping measurement, such as half-time of the charge decay, stretched or compressed exponential time constant of the charge decay, or others.

Although a single application of the photoneutralization method is described above, the techniques and benefits are not limited to only bare SiC doping monitoring. More generally, the corona photoneutralization technique can be applied to characterizing other wide bandgap material and structures, such as GaN and HEMTs. For example, the technique can be applied to determination of HEMT properties such as pinch off voltage ($V_p$) and 2DEG sheet charge.

Accordingly, other embodiments are in the following claims.

What is claimed is:

1. A method of characterizing a property of a semiconductor in a wide bandgap semiconductor sample, the method comprising:
   measuring an initial value, $V_0$, of a surface voltage at a region of a surface of the semiconductor sample in the dark;
   charging the region to deep depletion in the dark by depositing a prescribed corona charge at the region;
   measuring the surface voltage value in the dark at the region after charging;
   illuminating the charged region with light of a specific photon flux, $\phi_{eff}$, having a photon energy above the semiconductor bandgap sufficient to generate free minority carriers in the semiconductor sample causing photoneutralization of the corona charge;
   monitoring of a photoneutralization induced corona charge decay at the region vs. illumination time, t, using a noncontact time resolved measurement of surface voltage, V(t);
   analyzing the monitored time resolved surface voltage decay data V(t) to determine values for a parameter characteristic of a photoneutralization induced corona charge decay at the regions; and
   using the parameter at a specific photon flux, $\phi_{eff}$, to characterize the property of the semiconductor at the region based on the values of the parameter.

2. The method of claim 1, wherein the property of the is a doping concentration, $N_D$, and the parameter characteristic of the photoneutralization induced corona charge decay is a photoneutralization time constant, $\pi_{ph}$, at a specific photon flux, $\phi_{eff}$.

3. The method of claim 2, further comprising characterizing a doping concentration depth profile for the semiconductor sample based on a surface voltage specific corona charge photoneutralization time constant $\tau_{ph}$ versus V.

4. The method of claim 3, wherein characterizing a doping concentration depth profile in an epitaxial wafer with multiple layers of different doping includes determining the transition surface voltage values between the different doping layer concentrations.

5. The method of claim 4, wherein the epitaxial wafer is a AlGaN/GaN HEMT structure.

6. The method of claim 5, wherein the transition surface voltage corresponds to the HEMT pinch-off voltage, $V_P$.

7. The method of claim 2, further comprising characterizing doping of the single epitaxial layer based on an average $\tau_{ph}$ value over a range of surface voltages.

8. The method of claim 2, wherein $\pi_{ph}$, is determined according to the equation:

$$\tau_{ph}^{-1} = -\frac{d\ln|V(t) - V_{const}|}{dt}$$

in which t is an illumination time and $V_{const}$ is a surface voltage probe offset.

9. The method of claim 8, further comprising determining a calibration function, $\tau_{ph}$ vs $N_D$, and an inverse calibration function, $N_D$ vs $\tau_{ph}$, denoted feat using a calibrating measurement of Tur on one or more reference samples with known doping concentration values, $N_D$.

10. The method of claim 9, further comprising:
normalizing a time constant, $\tau_{ph}$, measured at an effective photon flux, $\phi_{eff}$, to a calibration photon flux, $\phi_{cal}$, as:

$$\tau_{ph}^* = \frac{\phi_{eff}}{\phi_{cal}} \cdot \tau_{ph};$$

and
determining an absolute doping concentration using the normalized time constant $\tau_{ph}^*$ according to the equation:

$N_D = \tau_{ph} \cdot f_{cal}$.

11. The method of claim 8, further comprising calibrating $\tau_{ph}$ for a doping concentration, wherein the calibration is specific to the semiconductor wafer sample, and it is performed on one site of the measured wafer sample during the multi-site $\tau_{ph}$ based characterization of the wafer sample with all $\tau_{ph}$ measurements being performed under the same illumination condition.

12. The method of claim 11, wherein the calibration comprises the measurement of the corona charge photoneutralization time constant, $\tau_{ph}$, and the independent measurement of the doping concentration, $N_D$, with the corona noncontact C-V (CnCV) method, wherein both measurements are performed in sequence, one after another, at the same wafer site, and in a similar corona charge induced depletion voltage range.

13. The method of claim 12, further comprising the use of $\tau_{ph}$ and $N_D$ to determine the wafer specific inverse calibration function value, $f_{cal}$, satisfying $N_D = \pi_{ph} \cdot f_{cal}$.

14. The method of claim 11, further comprising determining a doping concentration at all different wafer sites, based on determining $\pi_{ph}$ at each wafers site, and using the wafer specific value of $f_{cal}$, determined on a single site.

15. The method of claim 1, wherein the surface voltage is measured using a non-contact vibrating Kelvin probe.

16. The method of claim 1, wherein the region is illuminated simultaneously with monitoring the surface voltage.

17. The method of claim 1, wherein the region is illuminated separate from monitoring the surface voltage.

18. The method of claim 1, wherein the semiconductor sample comprises a semiconductor selected from the group consisting of SiC, GaN, and AlGaN.

19. The method of claim 1, further comprising identifying a defective region of the semiconductor sample based on $V_{Dark}$ and a dark decay rate $\Delta V_{Dark}/\Delta t_{Dark}$ measured after corona charging but before the illuminating.

20. The method of claim 19, wherein after identifying an inaccurate measurement on a defective wafer region, the remeasurement is performed on a neighboring location free of defects causing dark surface voltage decay interfering with the photoneutralization based determination of semiconductor parameters.

21. The method of claim 1, further comprising identifying a contribution to the monitored surface voltage from surface photovoltaic effects other than the corona photoneutralization based on a dark decay magnitude, $\Delta V_{Dark}$, measured after the illuminating.

22. The method of claim 1, wherein the surface voltage is measured using a transparent probe.

23. The method of claim 1, further comprising stabilizing fresh epitaxial SiC wafer samples before measurement using a UV pretreatment chamber.

24. The method of claim 23, wherein the stabilizing pretreatment is performed concurrently with the doping measurement on sets of multiple wafer samples.

* * * * *